United States Patent
Hirano et al.

(10) Patent No.: US 11,222,781 B2
(45) Date of Patent: Jan. 11, 2022

(54) METHOD FOR REMOVING ORGANIC CURED FILM ON SUBSTRATE, AND ACIDIC CLEANING LIQUID

(71) Applicant: Tokyo Ohka Kogyo Co., Ltd., Kanagawa (JP)

(72) Inventors: Isao Hirano, Kanagawa (JP); Takehiro Seshimo, Kanagawa (JP); TseWei Yu, Kanagawa (JP); YaChien Chuang, Kanagawa (JP)

(73) Assignee: TOKYO OHKA KOGYO CO., LTD., Kanagawa (JP)

( * ) Notice: Subject to any disclaimer, the term of this patent is extended or adjusted under 35 U.S.C. 154(b) by 56 days.

(21) Appl. No.: 16/232,621

(22) Filed: Dec. 26, 2018

(65) Prior Publication Data
US 2019/0198314 A1   Jun. 27, 2019

(30) Foreign Application Priority Data
Dec. 27, 2017  (JP) .............................. JP2017-252656

(51) Int. Cl.
| | |
|---|---|
| *H01L 21/02* | (2006.01) |
| *H01L 21/3213* | (2006.01) |
| *C11D 11/00* | (2006.01) |
| *H01L 21/311* | (2006.01) |
| *C11D 7/50* | (2006.01) |
| *C11D 7/08* | (2006.01) |
| *H01L 21/027* | (2006.01) |
| *H01L 21/67* | (2006.01) |

(52) U.S. Cl.
CPC .......... *H01L 21/02068* (2013.01); *C11D 7/08* (2013.01); *C11D 7/5004* (2013.01); *C11D 11/0047* (2013.01); *H01L 21/0206* (2013.01); *H01L 21/02082* (2013.01); *H01L 21/31133* (2013.01); *H01L 21/31144* (2013.01); *H01L 21/32139* (2013.01); *H01L 21/0271* (2013.01); *H01L 21/67138* (2013.01)

(58) Field of Classification Search
CPC combination set(s) only.
See application file for complete search history.

(56) References Cited

U.S. PATENT DOCUMENTS

| | | | | |
|---|---|---|---|---|
| 2008/0269096 A1* | 10/2008 | Visintin | ................ | C11D 3/042 510/176 |
| 2014/0363958 A1* | 12/2014 | Hatakeyama | ........... | G03F 7/425 438/514 |

FOREIGN PATENT DOCUMENTS

JP    2017-117938    6/2017

* cited by examiner

*Primary Examiner* — Erin F Bergner
(74) *Attorney, Agent, or Firm* — Wenderoth, Lind & Ponack, L.L.P.

(57) ABSTRACT

A method includes contacting an organic cured film with an acidic cleaning liquid including sulfuric acid and a water-soluble organic solvent and does not include a compound capable of generating nitronium ions. An amount of the sulfuric acid in the acidic cleaning liquid is 40% by mass or more, and an amount of water in the acidic cleaning liquid is 5% by mass or less.

12 Claims, No Drawings

METHOD FOR REMOVING ORGANIC CURED FILM ON SUBSTRATE, AND ACIDIC CLEANING LIQUID

This application is based on and claims the benefit of priority from Japanese Patent Application No. 2017-252656, filed on 27 Dec. 2017, the content of which is incorporated herein by reference.

BACKGROUND OF THE INVENTION

Field of the Invention

The present invention relates to a method for removing an organic cured film on a substrate, and an acidic cleaning liquid which can be preferably used in the method.

Related Art

In the production process of a semiconductor substrate, the process of forming a predetermined pattern is performed by etching a film to be etched, such as an interlayer insulating film or a metal film, formed on a substrate such as a semiconductor wafer using, as a mask material, an organic cured film such as a carbon hard mask.

After etching, the mask material remaining on the substrate is required to be removed from the substrate. There has been known, as such a removing method, for example, a method in which an organic cured film made of amorphous carbon is removed by a wet method using a mixed solution (SPM) of sulfuric acid and a hydrogen peroxide solution (see Japanese Unexamined Patent Application, Publication No. 2017-117938).

When the organic cured film is removed using the mixed solution (SPM) of sulfuric acid and a hydrogen peroxide solution, the organic cured film can be satisfactorily removed. However, there is a problem that damage on a wiring material such as a high dielectric constant material (High-k material) or copper formed on the substrate is likely to occur.

SUMMARY OF THE INVENTION

In light of the above problems, the present invention has been made. An object thereof is to provide a method for removing an organic cured film on a substrate, which can satisfactorily remove the organic cured film formed on the substrate while suppressing damage on a wiring material such as copper, and an acidic cleaning liquid which can be preferably used in the method.

The present inventors have found that the above problems can be solved by contacting an organic cured film with an acidic cleaning liquid when removing the organic cured film on a substrate and using, as the acidic cleaning liquid, an acidic cleaning liquid which includes sulfuric acid and a water-soluble organic solvent and does not include a compound capable of generating nitronium ions, the content of water being 5% by mass or less, and thus the present invention has been completed.

According to a first aspect of the present invention, there is provided a method including contacting an organic cured film on a substrate with an acidic cleaning liquid to thereby remove the organic cured film from the substrate, wherein the acidic cleaning liquid includes sulfuric acid and a water-soluble organic solvent and does not include a compound capable of generating nitronium ions, and the content of water in the acidic cleaning liquid is 5% by mass or less.

According to a second aspect of the present invention, there is provided an acidic cleaning liquid which is used to remove the organic cured film from the substrate in the method according to the first aspect, wherein the acidic cleaning liquid includes sulfuric acid and a water-soluble organic solvent and does not include a compound capable of generating nitronium ions, and the content of water in the acidic cleaning liquid is 5% by mass or less.

According to a third aspect of the present invention, there is provided an acidic cleaning liquid for removal of an organic cured film, which includes sulfuric acid and a water-soluble organic solvent and does not include a compound capable of generating nitronium ions, wherein the content of water is 5% by mass or less.

According to the present invention, it is possible to provide a method for removing an organic cured film on a substrate, which can satisfactorily remove the organic cured film formed on the substrate while suppressing damage on a wiring material such as copper, and an acidic cleaning liquid which can be preferably used in the method.

DETAILED DESCRIPTION OF THE INVENTION

<<Method for Removing Organic Cured Film>>

The method for removing an organic cured film is a method including contacting an organic cured film on a substrate with an acidic cleaning liquid to thereby remove the organic cured film from the substrate. The acidic cleaning liquid used in the method includes sulfuric acid and a water-soluble organic solvent and does not include a compound capable of generating nitronium ions. The content of water in the acidic cleaning liquid is 5% by mass or less.

In the above method, it is possible to satisfactorily remove the organic cured film formed on the substrate by using an acidic cleaning liquid satisfying the above-mentioned predetermined conditions while suppressing damage on a wiring material such as copper.

<Substrate>

There is no particular limitation on type of the substrate. The substrate may be, for example, a substrate made of an inorganic material, such as a silicon substrate, a glass substrate or a metal substrate, or may be a substrate made of a resin, for example, polyester such as PET, polycarbonate, polyimide and the like. The substrate is typically a semiconductor substrate such as a silicon substrate. When the substrate is a substrate made of a resin, in view of suppression of damage on the substrate, it is preferable to perform contact between the organic cured film and the acidic cleaning liquid by, for example, a paddle method such that the acidic cleaning liquid is not directly in contact with the substrate.

On the substrate, various other layers may be formed, in addition to the organic cured film. Examples of other layers include an insulating layer, a conductive layer (wiring material) made of conductive materials, for example, metals and metal oxides such as ITO, a semiconductor layer, an antireflection layer and the like. It is possible to use, as the wiring material, for example, aluminum (Al); aluminum alloys (Al alloys) such as aluminum-silicon (Al—Si), aluminum-copper (Al—Cu) and aluminum-silicon-copper (Al—Si—Cu); titanium (Ti); titanium alloys (Ti alloys) such as titanium nitride (TiN) and titanium tungsten (TiW); tantalum (Ta), tantalum nitride (TaN), tungsten (W), tungsten nitride (WN), copper (Cu), cobalt (Co) and the like. The insulating layer includes, for example, a SiO$_2$ film, a low dielectric constant film (Low-k film), a high dielectric constant film (High-k film) and the like. Examples of the Low-k film include a SiOC film, a SiCOH film and the like, which are films each having a relative dielectric constant lower than that of silicon dioxide. Examples of the High-k film include films made of materials such as hafnium oxide.

On the above-described substrate, the organic cured film, and if necessary, other layers are laminated so as to achieve the desired layer structure.

<Organic Cured Film>

The organic cured film may be an organic cured film which is used in various laminating processes such as a production process of a semiconductor device. The organic cured film includes, for example, an organic cured film which is used as a mask material, an antireflection film or the like. Curing means a concept including not only so-called chemical curing reaction such as a curing reaction of an epoxy resin but also curing of a physical film such as compaction of a film by baking a film including a resin.

The organic cured film preferably includes a resin having an ether bond and/or an ester bond in view of ease of removal using the below-mentioned acidic cleaning liquid.

The organic cured film includes a layer made of a thermosetting crosslinked polymer or the like, and a photoresist film (especially an ion-implanted photoresist film used as a mask material for an ion implantation process), and is typically an underlayer film such as an antireflection film, or a carbon hard mask film (organic hard mask film). When etching a layer to be etched on a substrate by microfabrication by a lithography process or the like to thereby form a pattern, a patterned layer made of a material having etch selectivity which is greatly different from that of the layer to be etched is formed, and etching of the layer to be etched is performed using the patterned layer as a mask. The layer that has etch selectivity which is greatly different from that of the layer to be etched and is used as the mask is referred to as a hard mask.

Examples of the commercially available antireflection film material include "SWK-EX1D55", "SWK-EX3", "SWK-EX4", "SWK-T5D60", "SWK-T7" and the like manufactured by TOKYO OHKA KOGYO CO., LTD.; materials which are commercially available under the trade name of "DW-42", "DW-44", "ARC-28", "ARC-29" and the like manufactured by Brewer Science, Inc.; and materials which are commercially available under the trade name of "AR-3", "AR-19" and the like manufactured by SHIPLEY INC.

Specific examples of the organic cured film will be described below with reference to several patent documents. The organic cured film is in no way limited to the below-described specific examples of the organic cured film. In the following description, the general formula mentioned in each patent document is cited as it is. Therefore, with respect to abbreviation for substituent or the like, the same abbreviation may be included in multiple different general formulas. Thus, when the same abbreviations are included in multiple different general formulas, the definition of each abbreviation follows the definition for each general formula.

There has been known, as the organic cured film used as the antireflection film, for example, an organic cured film (coating type underlayer film) formed using the composition as mentioned in JP 4895049 B1.

Specifically, the organic cured film (coating type underlayer film) formed using the composition mentioned in JP 4895049 B1 includes a compound represented by the following formula (1) or the following formula (2):

[Chem. 1]

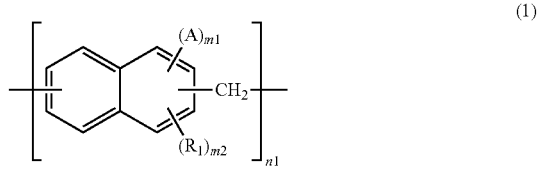

wherein A represents an organic group having an aromatic group, $R_1$ represents a hydroxy group, an alkyl group, an alkoxy group, a halogen group, a thiol group, an amino group or an amide group, m1 is the number of As substituted on a naphthalene ring and represents an integer of 1 or more and 6 or less, m2 is the number of $R_1$s substituted on a naphthalene ring and is an integer of 0 or more and 5 or less, the sum of m1+m2 is an integer of 1 or more and 6 or less, and when the sum thereof is other than 6, the remainder represents a hydrogen atom, and n1 represents a repeating unit of 2 or more and 7,000 or less:

[Chem. 2]

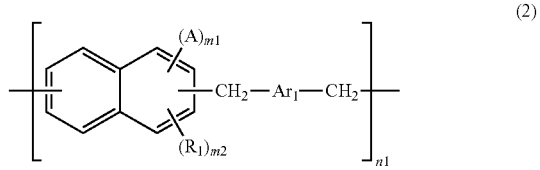

wherein A, $R_1$, m1, m2 and n1 have the same meaning as defined in formula (1), and $Ar_1$ is a substituted or unsubstituted aromatic group.

The compound represented by formula (1) is preferably a compound represented by the following formula (3):

[Chem. 3]

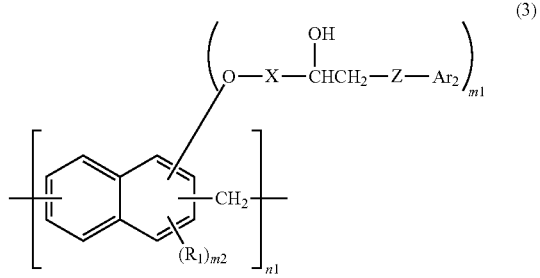

wherein X represents a single bond, a methylene group, an alkylene group having 2 or more and 10 or less carbon atoms, an ether bond-containing divalent hydrocarbon group having 2 or more and 10 or less carbon atoms or a carbonyl group, Z represents a linking group represented by —O— or —OC(=O)—, $Ar_2$ represents an unsubstituted aromatic ring or an aromatic ring substituted with carboxylic acid, a carboxylic acid ester group, a hydroxy group, an alkyl group, an alkoxy group, a sulfonic acid group or halogen, and $R_1$, m1, m2 and n1 have the same meaning as defined in formula (1).

The compound represented by formula (2) is preferably a compound represented by the following formula (4):

[Chem. 4]

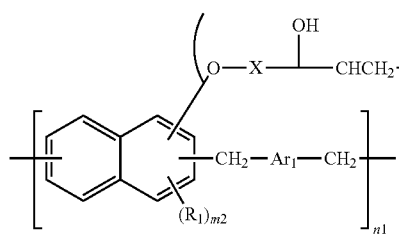

(4)

wherein X and Z have the same meaning as defined in formula (3), $Ar_1$ has the same meaning as defined in formula (2), $Ar_2$ has the same meaning as defined in formula (3), and $R_1$, m1, m2, and n1 have the same meaning as defined in formula (1).

Examples of the material of the carbon hard mask film include amorphous carbon and various resin materials. As the resin material, a resin having an aromatic group, such as a novolak resin or a polyhydroxystyrene resin is preferably used.

There has also been known, as the carbon hard mask film made of the resin having an aromatic group, for example, a hard mask film formed using the composition as mentioned in JP 4433933 B1.

Specifically, the composition mentioned in JP 4433933 B1 is a radiation-sensitive composition including a copolymer which includes a repeating unit represented by the following formula (5) and a repeating unit represented by the following formula (6), a radiation-sensitive acid generator and a solvent:

[Chem. 5]

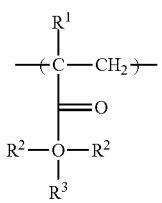

(5)

wherein, in formula (5), $R^1$ represents a hydrogen atom or a monovalent organic group (excluding those having an epoxy group), each $R^2$ independently represents a hydrogen atom or a monovalent organic group (excluding those having an epoxy group), and $R^3$ represents a monovalent organic group having an epoxy group:

[Chem. 6]

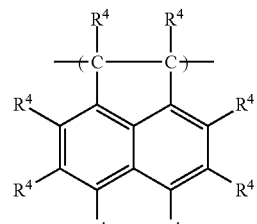

(6)

wherein, in formula (6), each $R^4$ independently represents a hydrogen atom or a monovalent organic group (excluding those having an epoxy group).

The hard mask film formed by using such a radiation-sensitive composition includes an aromatic group derived from a repeating unit represented by formula (6) or an ester bond derived from a repeating unit represented by formula (5). When epoxy groups represented by $R^3$ included in the repeating unit represented by formula (5) react with each other, an ether bond can be formed. Thus, the hard mask film may include a polymer having an ester bond or an ether bond.

The hard mask film may include fluorine, chlorine or a sulfur element. For example, a fluorine-containing functional group may be introduced into the material of the hard mask film for various purposes, and when a laminate including a hard mask film is subjected to dry etching using a fluorine-containing gas, the material of the hard mask film may be fluorinated.

Regarding the carbon hard mask film, other materials include, for example, materials mentioned in JP 5440755 B1, JP 5229044 B1, JP 5920588 B1, WO 2014/014034 A, JP 4639919 B1 and WO 2012/161126 A. The materials mentioned in the respective patent documents will be described below, and abbreviations for numbers, substituents or the like of the general formulas are described using the numbers mentioned in the respective patent documents, so that the numbers may overlap with each other.

JP 5440755 B1 discloses a polymer including a structural unit represented by the following formulas (1-1), (1-2), (1-3) or (1-4):

[Chem. 7]

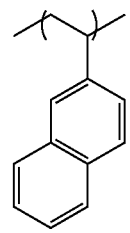

(1-1)

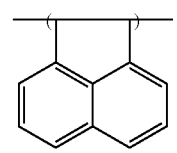

(1-2)

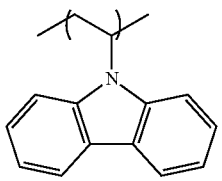
(1-3)

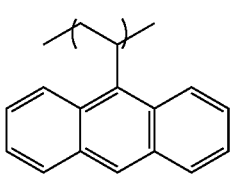
(1-4)

a structural unit represented by the following formula (7) and a structural unit represented by the following formula (8):

[Chem. 8]

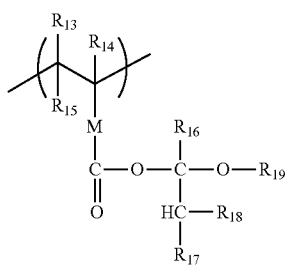
(7)

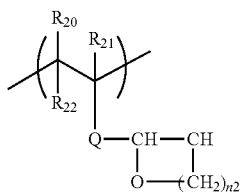
(8)

wherein $R_{13}$, $R_{14}$, $R_{15}$, $R_{20}$, $R_{21}$ and $R_{22}$ each represent a hydrogen atom, a halogen atom or an alkyl group having 1 to 3 carbon atoms, $R_{16}$, $R_{17}$ and $R_{18}$ each represent a hydrogen atom or a chain or cyclic alkyl group having 1 to 10 carbon atoms, $R_{19}$ represents a chain or cyclic alkyl group having 1 to 10 carbon atoms or an aromatic group having 6 to 20 carbon atoms, $R_{17}$ and $R_{18}$ may be combined with each other to form a ring, M and Q each represent a direct bond or a linking group, and n2 represents an integer of 0 or 1, wherein, when the total number of all structural units constituting the polymer is 1.0, the proportion of the number (a) of a structural unit represented by formula (1-1), formula (1-2), formula (1-3) or formula (1-4), the proportion of the number (b) of a structural unit represented by formula (7) and the proportion of the number (c) of a structural unit represented by formula (8) satisfy the following relationships: $0.5 \leq a \leq 0.8$, $0.1 \leq b \leq 0.2$ and $0.1 \leq c \leq 0.3$.

The polymer usable as the carbon hard mask mentioned in JP 5440755 B1 has an ester bond derived from a unit represented by formula (7). The unit represented by formula (8) has an epoxy group (oxiranyl group) or an oxetanyl group, so that the polymer included in the carbon hard mask may have an ether bond by the reaction between these groups. The aromatic ring in the structural units represented by formulas (1-1) to (1-4) may be fluorinated by dry etching or the like using a fluorine-containing gas.

JP 5229044 B1 mentions that it is possible to use a polymer formed by using a composition including:

(A1) a polymer having an aromatic ring,
(B1) a compound represented by the following formula (9):

[Chem. 9]

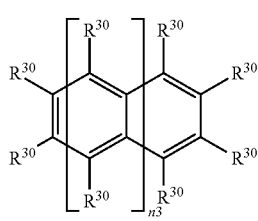
(9)

wherein, in formula (9), a plurality of $R^{30}$s each independently represent a hydrogen atom, an adamantyl group or a glycidyl ether group, one or two substituent(s) of the plurality of $R^{30}$s is/are adamantyl group(s) and one or two substituent(s) is/are glycidyl ether group(s), and n3 represents an integer of 0 or more and 3 or less, and (C1) an organic solvent, as a carbon hard mask. JP 5229044 B1 also mentions that it is possible to suitably use a novolak resin as (A1) the polymer having an aromatic ring.

The polymer mentioned in JP 5229044 B1 usable as the carbon hard mask has, for example, an ether bond formed by a reaction between a phenolic hydroxyl group and a glycidyl group which the compound represented by formula (10) has, when (A2) the polymer having an aromatic ring is a novolak resin. (A2) the polymer having an aromatic ring or an aromatic ring derived from the compound represented by formula (10) may be fluorinated by dry etching using a fluorine-containing gas.

JP 5920588 B1 mentions a polymer including a structural unit represented by the following formula (11):

$$—(—O—Ar_2—O—Ar_a\text{-}T\text{-}Ar_4—)—$$  (11)

wherein, in the formula (11), $Ar_2$, $Ar_3$ and $Ar_4$ each represent an organic group including an arylene group having 6 or more and 50 or less carbon atoms, and T represents a carbonyl group, or a combination of a structural unit represented by the following formula (12):

$$—(—O—Ar_1—)—$$  (12)

wherein, in the formula (12), $Ar_1$ represents an arylene group having 6 or more and 50 or less carbon atoms or an organic group including a heterocyclic group, and the structural unit represented by the above formula (11).

The polymer mentioned in JP 5229044 B1 usable as the carbon hard mask is an aromatic polyether and thus inevitably has an ether bond. The aromatic ring included in the polymer mentioned in JP 5229044 B1 may be fluorinated by dry etching or the like using a fluorine-containing gas.

WO 2014/014034 A mentions a polymer formed by using a composition including a resin having an aromatic ring, and a crosslinking agent having a partial structure represented by the following formula (i):

$$Ar—(X\text{-}Q)_{n4}$$  (i)

wherein, in formula (i),

X is a carbonyl group or a sulfonyl group,

Q is a monovalent heteroaromatic group or —OR$^{25}$,

R$^{25}$ is a monovalent organic group having 1 or more and 30 or less carbon atoms, Ar is an aromatic hydrocarbon group or a heteroaromatic group, n4 is an integer of 1 or more and 8 or less, and when n4 is 2 or more, a plurality of Xs and Qs may be the same or different.

WO 2014/014034 A mentions, as specific examples of the resin having an aromatic ring, polyarylene ether-based resins such as a novolak resin and a polyarylene ether, and discloses, as specific examples of the crosslinking agent, compounds having the following structures. The polymer produced by crosslinking the novolak resin with a crosslinking agent having the following structure has an ester bond. The polymer produced by crosslinking the polyarylene ether with a crosslinking agent having the following structure has an ether bond and an ester bond. When using a crosslinking agent having a 1,1,1,3,3,3-hexafluoropropan-2-yl group, the polymer thus produced can have a fluorine atom. The aromatic ring included in the polymer mentioned in WO 2014/014034 A may be fluorinated by dry etching or the like using a fluorine-containing gas.

[Chem. 10]

JP 4639919 B1 mentions use of a film formed by using a composition including a polymer which includes structural units represented by the following formulas (13) to (15):

[Chem. 11]

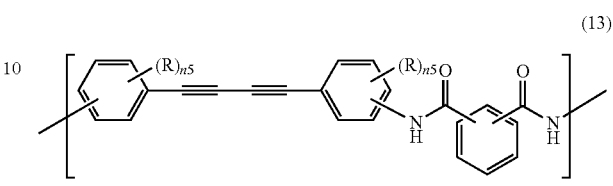

(13)

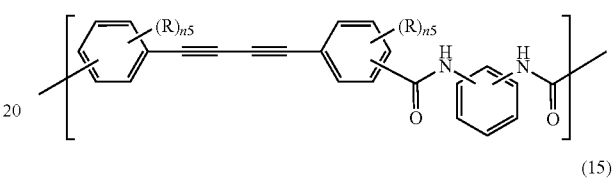

(14)

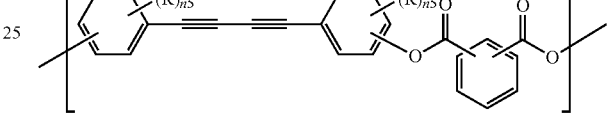

(15)

wherein, in the formulas (13) to (15), R represents a methyl group and n5 represents an integer of 0 or 1, as a hard mask film (see paragraphs [0035] to [0037]).

JP 4639919 B1 mentions that the composition may include, in addition to the above polymer, various resins such as polyethers, polyamides, polyesters and polyimides (see paragraphs [0063] to [0065]). In other words, the hard mask film formed by using the composition mentioned in JP 4639919 B1 can have an amide bond and an ester bond derived from the structural units represented by the formulas (13) to (15) but also an ether bond, an amide bond, an ester bond and an imide bond derived from a binder resin. The aromatic ring included in the hard mask film formed by using the composition mentioned in JP 4639919 B1 may be fluorinated by dry etching or the like using a fluorine-containing gas.

The polymer usable as the carbon hard mask mentioned in WO 2012/161126 A mentions a carbon hard mask film formed by using a composition including a polymer (A3) which includes a structural unit represented by the following formula (16) and a structural unit represented by the following formula (17):

[Chem. 12]

(16)

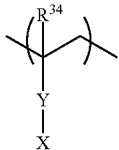

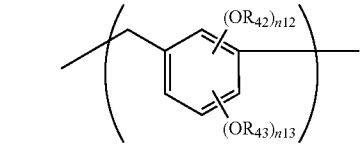

wherein, in the formula (16), $R^{31}$ represents a hydrogen atom or a methyl group, $R^{32}$ represents an alkylene group having 1 or more and 3 or less or an optionally substituted phenylene group, and $R^{33}$ represents a hydroxy group or a carboxy group: wherein, in the formula (17), $R^{34}$ represents a hydrogen atom or a methyl group, Y represents a linking group represented by a —C(=O)—NH— group or a —C(=O)—O— group, X represents a group having a lactone ring, a group having an adamantane ring, or an optionally substituted benzene ring group, an optionally substituted naphthalene ring group or an optionally substituted anthracene ring group, and a carbon atom of the linking group represented by Y is combined with a main chain of the polymer, a crosslinkable compound (B3) having at least two groups of a blocked isocyanate group, a methylol group or an alkoxymethyl group having 1 or more and 5 or less carbon atoms, and a solvent (C3).

The polymer included in the hard mask film formed by using the composition mentioned in WO 2012/161126 A has an amide bond derived from a structural unit represented by formula (16) or a structural unit represented by formula (17), and an ester bond derived from a structural unit represented by formula (17).

As mentioned in several aforementioned patent documents, the film formed by using a composition including a polymer having a desired structure and a crosslinking agent is preferably used as a carbon hard mask film. Examples of general crosslinking agents mixed in a composition for formation of a carbon hard mask film include melamine-based crosslinking agents and substituted urea-based crosslinking agents mentioned in JP 5920588 B1, or oligomers or polymers thereof. A crosslinking agent having at least two crosslinkage-forming substituents is preferable and, for example, it is possible to particularly preferably use, as the crosslinking agent, a compound such as methoxymethylated glycol uryl, butoxymethylated glycol uryl, methoxymethylated melamine, butoxymethylated melamine, methoxymethylated benzoguanamine, butoxymethylated benzoguanamine, methoxymethylated urea, butoxymethylated urea, methoxymethylated thiourea or butoxymethylated thiourea, and a compound having a crosslinkage-forming substituent having an aromatic ring (e.g., benzene ring, naphthalene ring) in the molecule, which is a crosslinking agent having high heat resistance mentioned in paragraph [0035] of JP 5867732 B1.

Examples of such a compound include a compound having a partial structure represented by the following formula (18), and a polymer or oligomer including a repeating unit represented by the following formula (19):

[Chem. 13]

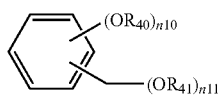

wherein, in formula (18), $R_{40}$ and $R_{41}$ each represent a hydrogen atom, an alkyl group having 1 or more and 10 or less carbon atoms, or an aryl group having 6 or more and 20 or less carbon atoms, n10 represents an integer of 1 or more and 4 or less, n11 represents an integer of 1 or more and (5−n10) or less, and (n10+n11) represents an integer of 2 or more and 5 or less:

wherein, in formula (19), $R_{42}$ represents a hydrogen atom or an alkyl group having 1 or more and 10 or less carbon atoms, $R_{43}$ represents an alkyl group having 1 or more and 10 or less carbon atoms, n12 represents an integer of 1 or more and 4 or less, n13 represents 0 or more and (4−n12) or less, and (n12+n13) represents an integer of 1 or more and 4 or less. The oligomer and polymer can be used in a range where the number of the repeating units is 2 or more and 100 or less, or 2 or more and 50 or less.

By contacting the organic cured film made of the above-described material, such as an antireflection film, a carbon hard mask film or a photoresist film with the below-mentioned acidic cleaning liquid, the organic cured film is satisfactorily removed.

<Acidic Cleaning Liquid>

An acidic cleaning liquid includes sulfuric acid and a water-soluble organic solvent, and does not include a compound capable of generating nitronium ions. The content of water in the acidic cleaning liquid is 5% by mass or less.

[Sulfuric Acid]

The acidic cleaning liquid includes sulfuric acid. When the organic cured film is denatured or decomposed by sulfuric acid, it is possible to remove the organic cured film from the substrate using the acidic cleaning liquid.

The content of sulfuric acid in the acidic cleaning liquid is not particularly limited as long as the organic cured film can be satisfactorily removed from the substrate. The content of sulfuric acid in the acidic cleaning liquid acidic cleaning liquid is preferably 40% by mass or more, more preferably 50% by mass or more, still more preferably 70% by mass or more, and particularly preferably 80% by mass or more, in view of performance of removing the organic cured film. The upper limit of the content of sulfuric acid in the acidic cleaning liquid is, for example, 95% by mass or less, and preferably 90% by mass or less.

[Compound Capable of Generating Nitronium Ions]

The acidic cleaning liquid does not include a compound capable of generating nitronium ions. Examples of the compound capable of generating nitronium ions include nitric acid, nitrates (e.g., potassium nitrate and sodium nitrate), nitronium tetrafluoroborate ($NO_2BF_4$), nitronium perchlorate ($NO_2ClO_4$), nitronium fluorosulfate ($NO_2SO_3F$), and nitronium trifluoromethanesulfonate ($NO_2SO_2CF_3$).

When the acidic cleaning liquid does not include a compound capable of generating nitronium ions, damage on a wiring material such as copper is suppressed when removing the organic cured film. When the acidic cleaning liquid includes a compound capable of generating nitronium ions such as sulfuric acid, together with nitric acid or the like, an explosive nitro compound may be produced by nitration of the organic cured film or a decomposition product of the organic cured film. However, an acidic cleaning liquid including no compound capable of generating nitronium ions is used in the above method, so that there is no fear of production of an explosive nitro compound. There is also no fear of the occurrence of bumping of the acidic cleaning liquid due to rapid proceeding of a nitration reaction accompanied by heat generation.

Due to contamination of an apparatus for producing an acidic cleaning liquid or a container for storing an acidic cleaning liquid, contamination to raw materials for producing an acidic cleaning liquid, etc., the acidic cleaning liquid may inevitably include a small amount of a compound capable of generating nitronium ions. However, inevitable mixing of a small amount of the compound capable of generating nitronium ions in the acidic cleaning liquid is permitted as long as the objects of the present invention are not impaired. The content of the compound capable of generating nitronium ions in the acidic cleaning liquid may be typically 1% by mass or less, preferably 0.5% by mass or less, and more preferably 0.1% by mass or less.

[Water]

The content of water in the acidic cleaning liquid is 5% by mass or less. Thus, when the acidic cleaning liquid includes only a small amount of water, it is possible to suppress damage on a wiring material such as copper when removing the organic cured film.

The content of water in the acidic cleaning liquid is preferably 3% by mass or less, more preferably 1% by mass, still more preferably 0.5% by mass, and particularly preferably 0.1% by mass or less. It is most preferable that the acidic cleaning liquid does not include water.

[Anticorrosion Agent and/or Surfactant]

The acidic cleaning liquid may further include an anticorrosion agent and/or a surfactant. When the acidic cleaning agent includes the anticorrosion agent, it is easier to suppress damage on a wiring material such as copper when removing the organic cured film. When the acidic cleaning liquid includes the surfactant, the wettability of the acidic cleaning liquid to a surface of the organic cured film is improved. Therefore, even if the organic cured film is finely patterned, the acidic cleaning liquid easily penetrates into the details, and thus it is easy to satisfactorily peel the organic cured film.

(Anticorrosion Agent)

The anticorrosion agent is not particularly limited and it is possible to use conventionally known anticorrosion agents. The anticorrosion agent is preferably a benzotriazole-based compound or a mercapto group-containing compound.

Examples of the benzotriazole-based compound include a compound represented by the following formula (f-1).

[Chem. 14]

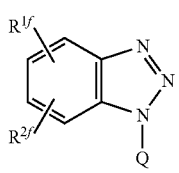

(f-1)

In formula (f-1), $R^{1f}$ and $R^{2f}$ each independently represent a hydrogen atom, an optionally substituted hydrocarbon group having 1 or more and 10 or less carbon atoms, a carboxy group, an amino group, a hydroxyl group, a cyano group, a formyl group, a sulfonylalkyl group or a sulfo group, Q represents a hydrogen atom, a hydroxyl group, an optionally substituted hydrocarbon group having 1 or more and 14 or less carbon atoms (the hydrocarbon group may be interrupted by an amide bond or an ester bond), or a group represented by the following general formula (f-2).

[Chem. 15]

(f-2)

In formula (f-2), $R^{3f}$ represents an alkylene group having 1 or more and 6 or less carbon atoms, and $R^{4f}$ and $R^{5f}$ each independently represent a hydrogen atom, a hydroxyl group, or a hydroxyalkyl group or alkoxyalkyl group having 1 or more and 6 or less carbon atoms.

In formula (f-1), in each definition of $R^{1f}$, $R^{2f}$ and Q, the hydrocarbon group may be any of an aromatic hydrocarbon group and an aliphatic hydrocarbon group, and may have an unsaturated bond, and may be linear, branched or cyclic. The aromatic hydrocarbon group includes, for example, a phenyl group, a p-tolyl group and the like. The linear aliphatic hydrocarbon group includes, for example, a methyl group, an n-propyl group, a vinyl group and the like. The branched aliphatic hydrocarbon group includes, for example, an isobutyl group, a tert-butyl group and the like. The cyclic aliphatic hydrocarbon group includes, for example, a cyclopentyl group, a cyclohexyl group and the like. The hydrocarbon group having a substituent includes, for example, a hydroxyalkyl group, an alkoxyalkyl group and the like.

In formula (f-1), Q is preferably a group represented by formula (f-2). Of the group represented by formula (f-2), it is particularly preferable to select a group in which $R^{4f}$ and $R^{5f}$ each independently represent a hydroxyalkyl group or alkoxyalkyl group having 1 or more and 6 or less carbon atoms.

It is preferable that Q is selected such that a compound represented by formula (f-1) exhibits water solubility. Specifically, a hydrogen atom, an alkyl group having 1 or more and 3 or less carbon atoms (i.e., a methyl group, an ethyl group, a propyl group, an isopropyl group), a hydroxyalkyl group having 1 or more and 3 or less, a hydroxyl group and the like are preferable.

Specific examples of the benzotriazole-based compound include benzotriazole, 5,6-dimethylbenzotriazole, 1-hydroxybenzotriazole, 1-methylbenzotriazole, 1-aminobenzotriazole, 1-phenylbenzotriazole, 1-hydroxymethylbenzotriazole, methyl 1-benzotriazolecarboxylate, 5-methylbenzotriazole, 5-benzotriazolecarboxylic acid, 1-methoxy-benzotriazole, 1-(2,2-dihydroxyethyl)-benzotriazole, 1-(2,3-dihydroxypropyl)benzotriazole; 2,2'-{[(4-methyl-1H-benzotriazol-1-yl)methyl]imino}bisethanol, 2,2'-{[(5-methyl-1H-benzotriazol-1-yl)methyl] imino}bisethanol, 2,2'-{[(4-methyl-1H-benzotriazol-1-yl)methyl]imino}bisethane, 2,2'-{[(4-methyl-1H-benzotriazol-1-yl)methyl]imino}bispropane and the like, which are commercially available from BASF Corporation as the "IRGAMET" series. Of these, 1-(2,3-dihydroxypropyl)-benzotriazole, 2,2'-{[(4-methyl-1H-benzotriazol-1-yl) methyl]imino}bisethanol, 2,2'-{[(5-methyl-1H-benzotriazol-1-yl)methyl]imino}bisethanol and the like are preferable. These benzotriazole compounds may be used alone, or two or more thereof may be used in combination.

The mercapto group-containing compound is preferably a compound having a hydroxyl group and/or a carboxy group on at least one of the α-position and the β-position of a carbon atom bonded to a mercapto group. Specific examples of such a compound include 1-thioglycerol, 3-(2-aminophenylthio)-2-hydroxypropylmercaptan, 3-(2-hydroxyethylthio)-2-hydroxypropylmercaptan, 2-mercaptopropionic acid, 3-mercaptopropionic acid and the like. Among these, 1-thioglycerol is particularly preferably used. These mercapto group-containing compounds may be used alone, or two or more thereof may be used in combination.

When including the anticorrosion agent, the content thereof in the acidic cleaning liquid is preferably 0.1% by mass or more and 20% by mass or less, more preferably 0.5% by mass or more and 15% by mass or less, and particularly preferably 1% by mass or more and 10% by mass or less.

(Surfactant)

The surfactant is not particularly limited and it is possible to use conventionally known surfactants. It is possible to use any of an anionic surfactant, a cationic surfactant, an amphoteric surfactant and a nonionic surfactant as the surfactant.

The nonionic surfactant includes, for example, a nonionic surfactant represented by the following formula (f-3):

[Chem. 16]

$$R^{6f}-\underset{\underset{\underset{OH}{R^{10f}}}{\overset{|}{\underset{O}{|}}}}{\overset{R^{7f}}{\underset{|}{C}}}-C\equiv C-\underset{\underset{\underset{OH}{R^{10f}}}{\overset{|}{\underset{O}{|}}}}{\overset{R^{8f}}{\underset{|}{C}}}-R^{9f} \quad (f\text{-}3)$$

wherein, in the formula (f-3), $R^{6f}$ to $R^{9f}$ each independently represent a linear or branched alkyl group having 1 or more and 6 or less carbon atoms, $R^{10f}$ represents a linear or branched alkylene chain having 2 or more and 4 or less carbon atoms, and v and w each independently represent an integer of 0 or more and 30 or less.

$R^{6f}$ to $R^{9f}$ are preferably a methyl group, an ethyl group and an isopropyl group. $R^{6f}$ is preferably an ethylene chain, a propylene chain and a butylene chain.

v and w are preferably an integer of 0 or more and 16 or less.

Specific examples of the nonionic surfactant represented by the above general formula (f-3) include "Surfynol 104 series" and "Surfynol 400 series" manufactured by Air Products, Inc. Among these, "Surfynol 400 series" are preferable.

The anionic surfactant includes, for example, an anionic surfactant represented by the following formula (f-4):

$$R^{11f}-SO_3H \quad (f\text{-}4)$$

wherein, in formula (f-4), $R^{11f}$ represents a linear or branched alkyl group having 7 to 20 carbon atoms, and the alkyl group may have a hydroxyl group and/or a carboxyl group and may be interrupted by a phenylene group and/or an oxygen atom.

$R^{11f}$ is preferably a linear or branched alkyl group having 8 or more and 11 or less carbon atoms.

Specific examples of the anionic surfactant represented by the general formula (f-4) include n-octanesulfonic acid, n-nonanesulfonic acid, n-decanesulfonic acid and n-undecanesulfonic acid. Among these, n-octanesulfonic acid, n-nonanesulfonic acid and n-decanesulfonic acid are preferable.

The below-described fluorine-based surfactant is also preferable as the surfactant. Preferred specific examples of the fluorine-based surfactant include compounds represented by the following formulas (f-5) to (f-8):

[Chem. 17]

$$C_rF_{2r+1}COOH \quad (f\text{-}5)$$

$$(C_sF_{2s+1}SO_2)_2NH \quad (f\text{-}6)$$

$$(CF_2)_t\underset{SO_2}{\overset{SO_2}{\diagup}}\hspace{-0.5em}\diagdown\hspace{-0.5em}HN \quad (f\text{-}7)$$

$$O\underset{(CF_2)_u}{\overset{(CF_2)_u}{\diagup}}\hspace{-0.5em}\diagdown\hspace{-0.5em}N-R_f \quad (f\text{-}8)$$

wherein, in formulas (f-5) to (f-8), r represents an integer of 10 or more and 15 or less, s represents an integer of 1 or more and 5 or less, t represents 2 or 3, u represents 2 or 3, and $R_f$ represents a hydrogen atom or an alkyl group having 1 or more and 16 or less carbon atoms in which part or all of the hydrogen atoms are substituted with a fluorine atom. The alkyl group may include a hydroxyl group, an alkoxyalkyl group, a carboxyl group or an amino group.

Specifically, the fluorine-based surfactant represented by formula (f-5) is preferably a compound represented by the following formula (f-5a).

$$C_{10}F_{21}COOH \quad (f\text{-}5a)$$

Specifically, the fluorine-based surfactant represented by formula (f-6) is preferably a compound represented by the following formula (f-6a) or (f-6b).

$$(C_4F_9SO_2)_2NH \quad (f\text{-}6a)$$

$$(C_3F_7SO_2)_2NH \quad (f\text{-}6b)$$

Specifically, the fluorine-based surfactant represented by formula (f-7) is preferably a compound represented by the following formula (f-7a).

[Chem. 18]

$$\begin{array}{c} CF_2-SO_2 \\ \diagup \hspace{2em} \diagdown \\ CF_2 \hspace{2em} NH \\ \diagdown \hspace{2em} \diagup \\ CF_2-SO_2 \end{array} \quad (f\text{-}7a)$$

Specifically, the fluorine-based surfactant represented by formula (f-8) is preferably a compound represented by the following formula (f-8a).

[Chem. 19]

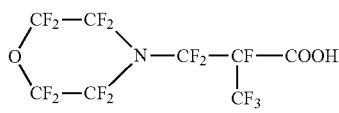

(f-8a)

When the acidic cleaning liquid includes the surfactant, the content thereof in the acidic cleaning liquid is preferably 0.1% by mass or more and 20% by mass, more preferably 0.5% by mass or more and 15% by mass or less, and particularly preferably 1% by mass or more and 10% by mass or less.

[Water-Soluble Organic Solvent]

The acidic cleaning liquid includes a water-soluble organic solvent. Sulfuric acid does not necessarily exhibit satisfactory wettability to the organic cured film because of its large surface tension. However, when the acidic cleaning liquid includes the water-soluble organic solvent, together with sulfuric acid, the surface tension of the acidic cleaning liquid decreases. Therefore, the acidic cleaning liquid exhibits satisfactory wettability to the surface of the organic cured film organic cured film. For this reason, when using the acidic cleaning liquid including sulfuric acid and the water-soluble organic solvent, even if the organic cured film is finely patterned, the acidic cleaning liquid easily penetrates into the details, and thus it is easy to satisfactorily peel the organic cured film.

Since the solvent is a water-soluble organic solvent, it is excellent in affinity to the organic cured film. Therefore, the water-soluble organic solvent accelerates peeling of the organic cured film modified or decomposed by sulfuric acid from the substrate.

When the water-soluble organic solvent is gently mixed with the same volume of water under 1 atm at a temperature of 20° C., the obtained mixed solution maintains uniform appearance even after the mixed solution becomes still.

Specific examples of the water-soluble organic solvent include:
sulfolane;
hexamethylphosphoric triamide;
sulfoxide such as dimethyl sulfoxide;
dimethylsulfone, diethylsulfone, ethylmethylsulfone, ethylisopropylsulfone, sulfones such as 3-methylsulfone, bis(2-hydroxyethyl)sulfone and tetramethylenesulfone;
amides such as N,N-dimethylformamide, N-methylformamide, N,N-dimethylacetamide, N-methylacetamide and N,N-diethylacetamide;
lactams such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone;
imidazolidinones such as 1,3-dimethyl-2-imidazolidinone, 1,3-diethyl-2-imidazolidinone and 1,3-diisopropyl-2-imidazolidinone;
alkanols such as methanol, ethanol and isopropyl alcohol;
polyhydric alcohols such as ethylene glycol, propylene glycol, 1,2-butylene glycol, 1,3-butylene glycol, 2,3-butylene glycol, glycerin and diethylene glycol; and
lactones such as β-propiolactone, γ-butyrolactone and δ-pentyrolactone.

Among these water-soluble organic solvents, alkanols or sulfolane are preferable since it is easy to satisfactorily remove the organic cured film using the acidic cleaning liquid. Alkanols mean a water-soluble alkane monool.

The content of the water-soluble organic solvent in the acidic cleaning liquid is not particularly limited as long as the organic cured film can be satisfactorily removed. The amount of the water-soluble organic solvent in the acidic cleaning liquid is preferably 50% by mass or less, more preferably 40% by mass or less, still more preferably 30% by mass or less, and particularly preferably 20% by mass or less, based on the mass of the acidic cleaning liquid. The lower limit of the content of the water-soluble organic solvent in the acidic cleaning liquid is, for example, 1% by mass or more, preferably 5% by mass or more, and particularly preferably 10% by mass or more, based on the mass of the acidic cleaning liquid.

[Method for Producing Acidic Cleaning Liquid]

The acidic cleaning liquid can be prepared by uniformly mixing each desired amount of the above-described components. To remove molten residue and insoluble impurities during preparation, the acidic cleaning liquid may be optionally filtered through a filter.

<Removal of Organic Cured Film>

By contacting the above-described acidic cleaning liquid with an organic cured film on a substrate, the organic cured film is removed from the substrate. There is no particular limitation on the method of contacting the acidic cleaning liquid with the organic cured film. Examples of preferred method include the following methods 1) to 4). Among the following methods, 1) an immersion method is preferable in view of simple operation and ease of contacting the acidic cleaning liquid with the entire organic cured film.

1) Method in which a substrate including an organic cured film is immersed in an acidic cleaning liquid
2) Method in which an acidic cleaning liquid is filled up on an organic cured film on a substrate
3) Method in which an acidic cleaning liquid is sprayed on an organic cured film on a substrate
4) Method in which an acidic cleaning liquid is allowed to flow on a surface of an organic cured film on a substrate The temperature of the acidic cleaning liquid to be contacted with the organic cured film is not particularly limited as long as the objects of the present invention are not impaired. Typically, in view of the achievement of a balance between satisfactory removal of the organic cured film and suppression of damage on a wiring material or the like, the temperature is preferably 10° C. or higher and 80° C. or lower, more preferably 10° C. or higher and 70° C. or lower, and particularly preferably 10° C. or higher and 60° C. or lower.

The contact time between the organic cured film and the acidic cleaning liquid is not particularly limited as long as the organic cured film can be satisfactorily removed. Although it varies depending on the temperature of the acidic cleaning liquid, typically, the contact time is preferably 10 seconds or more and 1 hour or less, more preferably 30 seconds or more and 30 minutes or less, and particularly preferably 1 minute or more and 10 minutes or less.

After contacting the organic cured film with the acidic cleaning liquid for a desired time, the surface of the substrate is optionally cleaned with water or an organic solvent. After cleaning, the substrate is dried to obtain a substrate from which the organic cured film has been removed. The thus obtained substrate from which the organic cured film has been removed is used as a product as it is or subjected to processing as the subsequent process according to application of the substrate.

EXAMPLES

The present invention will be described in more detail below by way of Examples. The present invention is not limited to these Examples.

Examples 1 to 7, Comparative Examples 1 to 5

An acid component and an organic solvent of each type shown in Table 1 were mixed in each concentration shown in Table 1 to prepare acidic cleaning liquids of Examples 1 to 7, Comparative Example 1 and Comparative Examples 3 to 5. In Comparative Example 2, a mixed solution of monoethanolamine (50% by mass) and DMSO (dimethylsulfoxide) (50% by mass) was used.

In the preparation of the acidic cleaning liquid, sulfuric acid having a concentration of 98% by mass was used as sulfuric acid, nitric acid having a concentration of 69% by mass was used as nitric acid, hydrochloric acid having a concentration of 20% by mass was used as hydrochloric acid, and hydrogen peroxide having a concentration of 31% by mass was used as hydrogen peroxide. Sulfuric acid, nitric acid, hydrochloric acid and hydrogen peroxide shown in Table 1 are sulfuric acid having a concentration of 98% by mass, nitric acid having a concentration of 69% by mass, hydrochloric acid having a concentration of 20% by mass and hydrogen peroxide having a concentration of 31% by mass, respectively.

Organic solvents shown in Table 1 are as follows.
S1: Sulfolane
S2: Methanol
S3: Isopropyl alcohol In Example 5, 5% by mass of an anticorrosion agent (5-methylbenzotriazole) was included in an acidic cleaning liquid. In Example 6, 5% by mass of a surfactant (the above-mentioned compound of formula (f-7a)) was included in an acidic cleaning liquid.

Using the cleaning liquids of the respective Examples and Comparative Examples, removal of an organic cured film and damage of a wiring material were evaluated according to the following methods. These evaluation results are shown in Table 1.

[Removal of Organic Cured Film]

As a substrate for test, a silicon substrate including a film A as an organic cured film and a silicon substrate including a film B as an organic cured film were used. As the material of the film A, a resin composed of a constitutional unit having the following structure was used. The film A has a thickness of 200 nm. The film B is an antireflection film having a thickness of 89 nm formed by using ARC-29 manufactured by Brewer Science, Inc.

[Chem. 20]

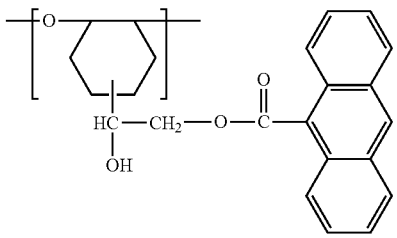

A silicon substrate including an organic cured film on a surface was immersed in each of the cleaning liquids of the respective Examples and Comparative Examples under the conditions in Table 1. After immersion, the substrate was cleaned with pure water and then dried with nitrogen blow. Regarding removal of the organic cured film, the case where the organic cured film could be completely removed by immersion for 3 minutes was rated "Good", whereas, the case where the organic cured film could not be completely removed by immersion for 3 minutes was rated "Bad".

[Damage of Wiring Material]

As a substrate for test, a silicon substrate including a copper film having a thickness of 200 nm on a surface and a silicon substrate including an aluminum film having a thickness of 100 nm on a surface were used. A silicon substrate including a wiring material on a surface was immersed in each of the cleaning liquids of the respective Examples and Comparative Examples under the conditions in Table 1. After immersion, the substrate was cleaned with pure water and then dried with nitrogen blow. Regarding damage on copper, the case where a decrease in thickness of the copper film after immersion of 3 minutes was 1 nm or less was rated "Good", whereas, the case where a decrease in thickness of the copper film after immersion of 3 minutes was more than 1 nm was rated "Bad". Regarding damage on aluminum, the case where partial peeling of the aluminum film was not observed after immersion for 3 minutes was rated "Good", whereas, the case where partial peeling of the aluminum film was observed after immersion for 3 minutes was rated "Bad".

TABLE 1

| | Composition of acidic cleaning liquid (Type/Content (% by mass)) | | | | | | Treatment conditions | Removal of organic cured film | | Damage of wiring material | |
|---|---|---|---|---|---|---|---|---|---|---|---|
| | Acid component | | Organic solvent | | Other components | | (Temperature (° C.)/Time | | | | |
| | Type | Content | Type | Content | Type | Content | (minutes)) | FilmA | FilmB | Cu | Al |
| Example 1 | Sulfuric acid | 80 | S1 | 20 | — | — | 25/3 | Good | Good | Good | Good |
| Example 2 | Sulfuric acid | 80 | S2 | 20 | — | — | 25/3 | Good | Good | Good | Good |
| Example 3 | Sulfuric acid | 80 | S3 | 20 | — | — | 25/3 | Good | Good | Good | Good |
| Example 4 | Sulfuric acid | 50 | S1 | 50 | — | — | 25/3 | Good | Good | Good | Good |
| Example 5 | Sulfuric acid | 76 | S1 | 19 | Anticorrosion agent | 5 | 25/3 | Good | Good | Good | Good |
| Example 6 | Sulfuric acid | 76 | S1 | 19 | Surfactant | 5 | 25/3 | Good | Good | Good | Good |
| Example 7 | Sulfuric acid | 80 | S1 | 20 | — | — | 60/3 | Good | Good | Good | Good |
| Comparative Example 1 | Sulfuric acid | 80 | — | — | Hydrogen peroxide | 20 | 25/3 | Good | Good | Bad | Bad |
| Comparative Example 2 | Mixed solution of Monoethanolamine and DMSO | | | | | | 25/3 | Bad | Bad | Good | Good |

TABLE 1-continued

| | Composition of acidic cleaning liquid (Type/Content (% by mass)) | | | | | | Treatment conditions | Removal of organic cured film | | Damage of wiring material | |
|---|---|---|---|---|---|---|---|---|---|---|---|
| | Acid component | | Organic solvent | | Other components | | (Temperature (° C.)/Time | | | | |
| | Type | Content | Type | Content | Type | Content | (minutes)) | FilmA | FilmB | Cu | Al |
| Comparative Example 3 | Hydrochloric acid | 80 | S1 | 20 | — | — | 25/3 | Bad | Bad | Good | Bad |
| Comparative Example 4 | Nitric acid | 80 | S1 | 20 | — | — | 25/3 | Good | Bad | Bad | Bad |
| Comparative Example 5 | Sulfuric acid Nitric acid | 80 10 | S1 | 10 | — | — | 25/3 | Good | Good | Bad | Bad |

As can be seen from Table 1, when using an acidic cleaning liquid which includes sulfuric acid and a water-soluble organic solvent and does not include a compound capable of generating nitronium ions such as nitric acid, and includes only a small amount of water, it is possible to suppress damage on a wiring material such as copper or aluminum while satisfactorily peeling an organic cured film.

What is claimed is:

1. A method comprising:
contacting an organic cured film on a substrate with an acidic cleaning liquid to thereby remove the organic cured film from the substrate,
wherein the acidic cleaning liquid comprises sulfuric acid and a water-soluble organic solvent and does not comprise a compound capable of generating nitronium ions, and
wherein an amount of the sulfuric acid in the acidic cleaning liquid is 40% by mass or more and 90% by mass or less, and an amount of water in the acidic cleaning liquid is 5% by mass or less.

2. The method according to claim 1, wherein the acidic cleaning liquid further comprises an anticorrosion agent and/or a surfactant.

3. The method according to claim 1, wherein the organic cured film is a carbon hard mask.

4. The method according to claim 1, wherein the organic cured film comprises a resin having an ether bond and/or an ester bond.

5. The method according to claim 1, wherein the water-soluble organic solvent is an alkanol or sulfolane.

6. The method according to claim 1, wherein the acidic cleaning liquid contacting the organic cured film is at a temperature of 10° C. or higher and 80° C. or lower.

7. The method according to claim 1, wherein the substrate comprises a wiring material.

8. The method according to claim 1, wherein the water-soluble organic solvent is sulfolane, methanol, or isopropyl alcohol.

9. The method according to claim 1, wherein the amount of the sulfuric acid in the acidic cleaning liquid is 50% by mass or more.

10. The method according to claim 1, wherein the amount of the sulfuric acid in the acidic cleaning liquid is 50% by mass or more and 80% by mass or less.

11. The method according to claim 1, wherein a contact time between the organic cured film and the acidic cleaning liquid is 10 seconds or more and 1 hour or less.

12. The method according to claim 1, further comprising, after contacting the organic cured film with the acidic cleaning liquid, cleaning a surface of the substrate with water or an organic solvent, and then drying the substrate.

* * * * *